(12) United States Patent
Chang et al.

(10) Patent No.: US 9,704,969 B1
(45) Date of Patent: Jul. 11, 2017

(54) FIN SEMICONDUCTOR DEVICE HAVING MULTIPLE GATE WIDTH STRUCTURES

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/985,406

(22) Filed: Dec. 31, 2015

(51) Int. Cl.
*H01L 29/66* (2006.01)
*H01L 29/78* (2006.01)
*H01L 29/423* (2006.01)
*H01L 21/30* (2006.01)

(52) U.S. Cl.
CPC ........ *H01L 29/66545* (2013.01); *H01L 21/30* (2013.01); *H01L 29/42356* (2013.01); *H01L 29/66795* (2013.01); *H01L 29/7856* (2013.01)

(58) Field of Classification Search
CPC ......... H01L 29/66545; H01L 29/42356; H01L 29/66795; H01L 29/7856
See application file for complete search history.

(56) References Cited

U.S. PATENT DOCUMENTS

| | | | | |
|---|---|---|---|---|
| 6,001,692 A * | 12/1999 | Gil | ................. | H01L 21/823481 257/E21.552 |
| 8,659,097 B2 * | 2/2014 | Mor | ..................... | H01L 29/785 257/401 |
| 8,664,064 B2 * | 3/2014 | Kim | ................. | H01L 29/66621 257/296 |
| 9,048,219 B2 * | 6/2015 | Kim | .................... | H01L 27/0924 |
| 9,070,577 B2 * | 6/2015 | Lee | ..................... | H01L 27/0886 |
| 9,306,037 B2 * | 4/2016 | Lin | .................... | H01L 29/66795 |
| 9,537,010 B2 * | 1/2017 | Wang | ................. | H01L 29/7856 |
| 9,548,309 B2 * | 1/2017 | Park | .................... | H01L 29/0653 |
| 2005/0250285 A1 * | 11/2005 | Yoon | ....................... | H01L 21/84 438/283 |
| 2011/0068405 A1 * | 3/2011 | Yuan | ................. | H01L 29/66795 257/365 |
| 2012/0261726 A1 * | 10/2012 | Yang | ................. | H01L 21/28123 257/288 |
| 2015/0187571 A1 * | 7/2015 | Fan | ..................... | H01L 29/0653 257/401 |

(Continued)

*Primary Examiner* — Ida M Soward
(74) *Attorney, Agent, or Firm* — Jianq Chyun IP Office

(57) ABSTRACT

A semiconductor device including a substrate, a plurality of insulators, a dielectric layer and a plurality of gates is provided. The substrate includes a plurality of trenches and a semiconductor fin between trenches. The insulators are disposed in the trenches. The dielectric layer covers the semiconductor fin and the insulators. A lengthwise direction of the gates is different from a lengthwise direction of the semiconductor fin. The gates comprise at least one first gate that is penetrated by the semiconductor fin and at least one second gate that is not penetrated through by the semiconductor fin. The second gate comprises a broadened portion disposed on the dielectric layer and a top portion disposed on the broadened portion, wherein a bottom width of the broadened portion is greater than a width of the top portion.

16 Claims, 12 Drawing Sheets

(56) References Cited

U.S. PATENT DOCUMENTS

| | | | |
|---|---|---|---|
| 2015/0206890 A1* | 7/2015 | Liaw | H01L 27/1104 257/391 |
| 2015/0206956 A1* | 7/2015 | Kim | H01L 29/66795 438/294 |
| 2015/0236131 A1* | 8/2015 | Chang | H01L 29/66795 257/401 |
| 2015/0311342 A1* | 10/2015 | Lin | H01L 29/7848 257/190 |
| 2016/0049400 A1* | 2/2016 | Togo | H01L 27/0924 257/369 |
| 2016/0111449 A1* | 4/2016 | Hafez | H01L 29/66545 257/401 |
| 2016/0163799 A1* | 6/2016 | Kim | H01L 29/1083 257/203 |
| 2016/0225764 A1* | 8/2016 | Chang | H01L 27/0886 |
| 2017/0005005 A1* | 1/2017 | Chen | H01L 21/823437 |

\* cited by examiner

FIN SEMICONDUCTOR DEVICE HAVING MULTIPLE GATE WIDTH STRUCTURES

BACKGROUND

As the semiconductor devices keeps scaling down in size, three-dimensional multi-gate structures, such as the fin-type field effect transistors (FinFETs), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

For the gate replacement process of the FinFETs, dummy gate strips are replaced by sequentially formed metal gates. Before the gate replacement process is performed, wet cleaning processes are performed and peeling issue of dummy gate strips resulted from the aforesaid wet cleaning processes may induce low yield rate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
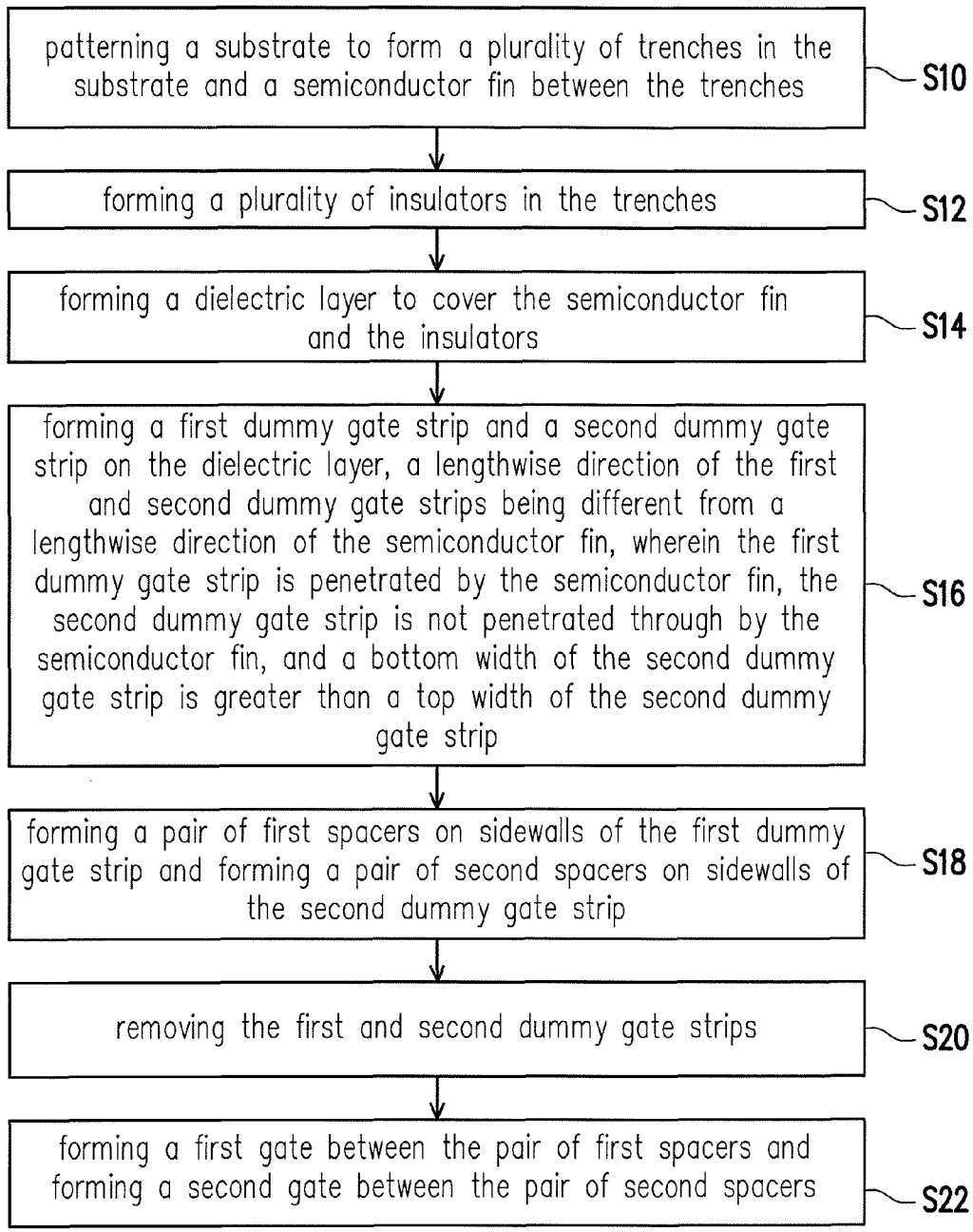
FIG. 1 is a flow chart illustrating a method for fabricating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of a semiconductor device which comprises a plurality of FinFETs with different gate profiles. The semiconductor device may be formed on bulk silicon substrates in certain embodiments of the present disclosure. Still, the semiconductor device may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

Referring to FIG. 1, illustrated is a flow chart illustrating a method for fabricating a semiconductor device in accordance with some embodiments of the present disclosure. The fabricating method at least includes steps S10, step S12, step S14, step S16, step S18, step S20 and step 22. First, in step S10, a substrate is provided and the substrate is then patterned to form a plurality of trenches and a semiconductor fin between the trenches. In step S12, a plurality of insulators are formed in the trenches. The insulators are shallow trench isolation (STI) structures for insulating semiconductor fin, for example. In step S14, a dielectric layer is formed to cover the semiconductor fin and the insulators. In step S16, a first dummy gate strip and a second dummy gate strip are formed on the dielectric layer, wherein a lengthwise direction of the first and second dummy gate strips is different from a lengthwise direction of the semiconductor fin, the first dummy gate strip is penetrated by the semiconductor fin, the second dummy gate strip is not penetrated through by the semiconductor fin, and a bottom width of the second dummy gate strip is greater than a top width of the second dummy gate strip. The first dummy gate strip and the second dummy gate strip are conductive strips, such as poly-silicon strips. In step S18, a pair of first spacers and a pair of second spacers are formed on sidewalls of the first and second dummy gate strips respectively. In step S20, the first and second dummy gate strips are removed. In step S22, a first gate and a second gate are formed between the pair of first spacers and the pair of second spacers respectively.

As illustrated in step S20 in FIG. 1, the first dummy gate strip and the second dummy gate strip may be formed by same deposition and chemical mechanical polish (CMP) processes and removal of the first dummy gate strip and the second dummy gate strip may be performed by the same etch process. Similarly, as illustrated in step S22 in FIG. 1, the first gate and the second gate may be formed by same deposition and chemical mechanical polish (CMP) processes.

Figure 2A:
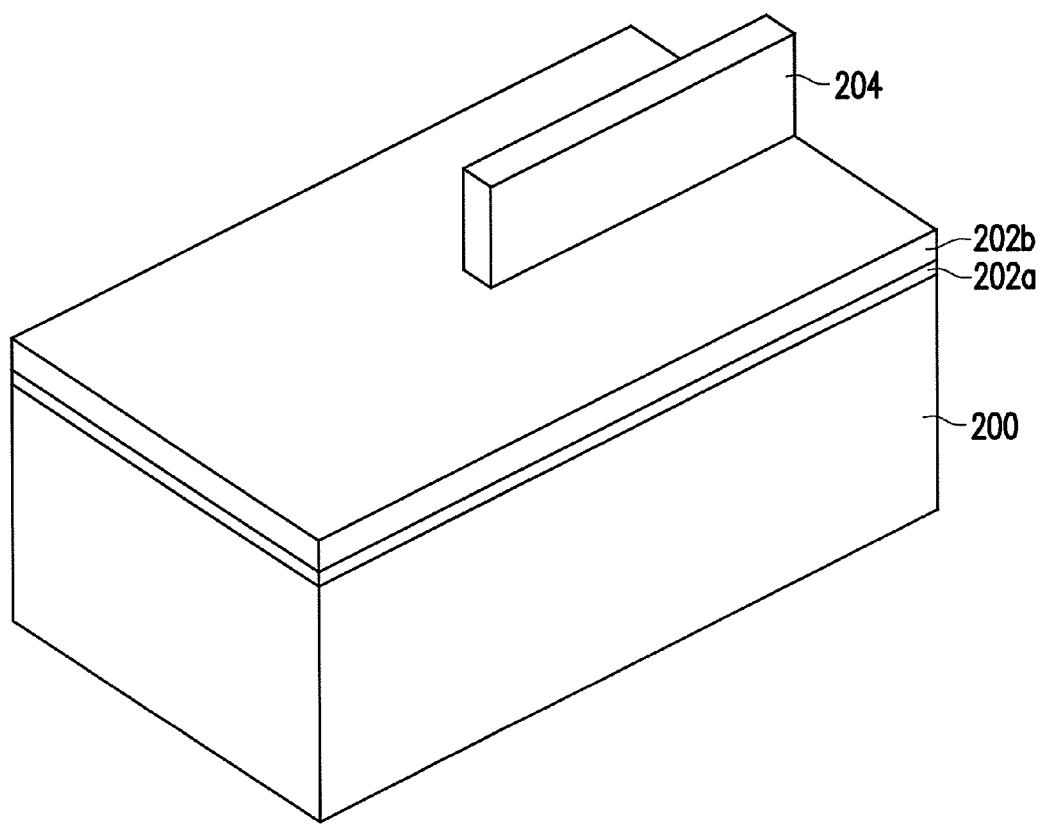
FIGS. 2A-2K are perspective views of a method for fabricating a semiconductor device in accordance with some embodiments.

FIG. 2A is a perspective view of the semiconductor device at one of various stages of the manufacturing method. In Step 10 in FIG. 1 and as shown in FIG. 2A, a substrate 200 is provided. In one embodiment, the substrate 200 comprises a crystalline silicon substrate (e.g., wafer). The substrate 200 may comprise various doped regions depending on design requirements (e.g., p-type substrate or n-type substrate). In some embodiments, the doped regions may be doped with p-type and/or n-type dopants. For example, the doped regions may be doped with p-type dopants, such as boron or $BF_2$; n-type dopants, such as phosphorus or arsenic; and/or combinations thereof. The doped regions may be configured for an n-type FinFET, a p-type FinFET or the combination thereof. In some alternative embodiments, the substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, a pad layer 202a and a mask layer 202b are sequentially formed on the substrate 200. The pad layer 202a may be a silicon oxide thin film formed, for example, by thermal oxidation process. The pad layer 202a may act as an adhesion layer between the substrate 200 and mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes. Then, a patterned photoresist layer 204 having a predetermined pattern is formed on the mask layer 202b.

Figure 2B:
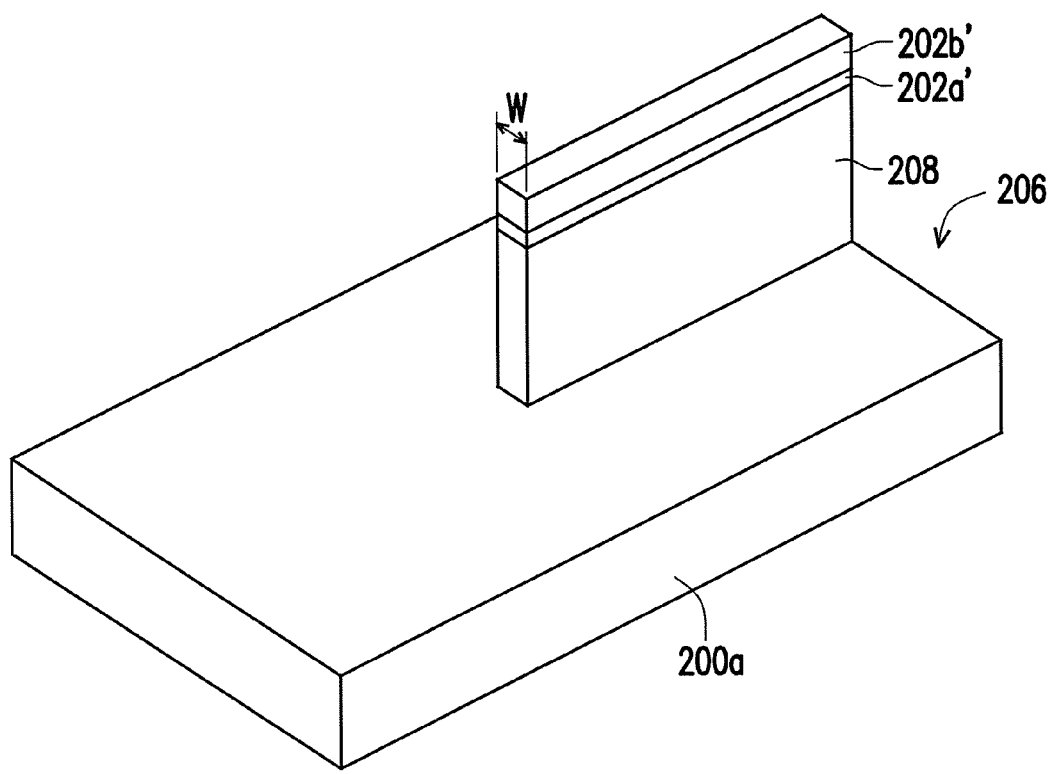

FIG. 2B is a perspective view of the semiconductor device at one of various stages of the manufacturing method. In Step S10 in FIG. 1 and as shown in FIGS. 2A-2B, the mask layer 202b and the pad layer 202a which are not covered by the patterned photoresist layer 204 are sequentially etched to form a patterned mask layer 202b' and a patterned pad layer 202a' so as to expose underlying substrate 200. By using the patterned mask layer 202b', the patterned pad layer 202a' and the patterned photoresist layer 204 as a mask, portions of the substrate 200 are exposed and etched to form trenches 206 and a semiconductor fin 208. After the substrate 200 is patterned, the semiconductor fin 208 is covered by the patterned mask layer 202b', the patterned pad layer 202a' and the patterned photoresist layer 204. In some embodiments, the number of the semiconductor fin 208 is not limited, two or more semiconductor fins 208 may be formed on the substrate 200a. The height of the semiconductor fin 208 and the depth of the trenches 206 range from about 5 nm to about 500 nm, for example. The width W of the semiconductor fin 208 may be smaller than about 30 nm, for example.

After the trenches 206 and the semiconductor fin 208 are formed, the patterned photoresist layer 204 is then removed. In one embodiment, a cleaning process may be performed to remove a native oxide of the substrate 200a and the semiconductor fin 208. The cleaning process may be performed using diluted hydrofluoric (DHF) acid or other suitable cleaning solutions.

Figure 2C:
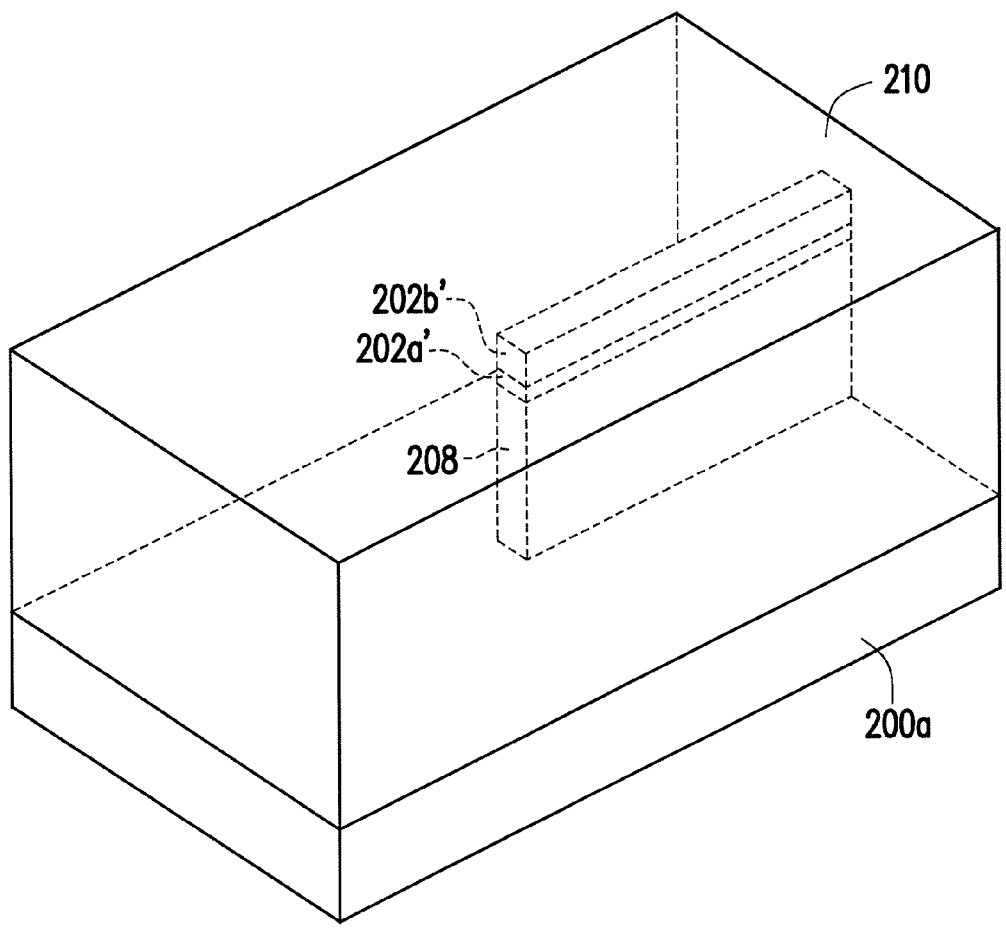

FIG. 2C is a perspective view of the semiconductor device at one of various stages of the manufacturing method. In Step S12 in FIG. 1 and as shown in FIGS. 2B-2C, an insulating material 210 are formed over the substrate 200a to cover the semiconductor fin 208 and fill up the trenches 206. In addition to the semiconductor fin 208, the insulating material 210 further covers the patterned pad layer 202a' and the patterned mask layer 202b'. The insulating material 210 may include silicon oxide, silicon nitride, silicon oxynitride, a spin-on dielectric material, or a low-K dielectric material. The insulating material 210 may be formed by high-density-plasma chemical vapor deposition (HDP-CVD), sub-atmospheric CVD (SACVD) or by spin-on.

Figure 2D:
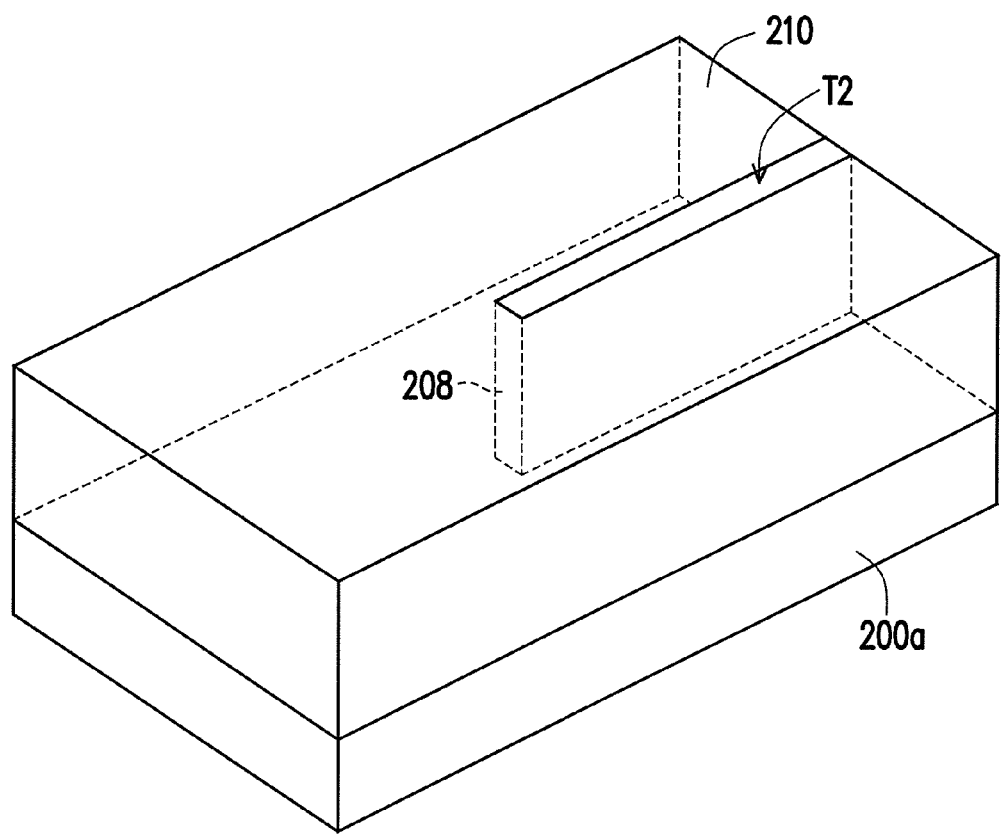

FIG. 2D is a perspective view of the semiconductor device at one of various stages of the manufacturing method. In Step S12 in FIG. 1 and as shown in FIGS. 2C-2D, a chemical mechanical polish (CMP) process is, for example, performed to remove a portion of the insulating material 210, the patterned mask layer 202b' and the patterned pad layer 202a' until the semiconductor fin 208 are exposed. As shown in FIG. 2D, after the insulating material 210 is polished, top surfaces of the polished insulating material 210 is substantially coplanar with top surface T2 of the semiconductor fin 208.

Figure 2E:
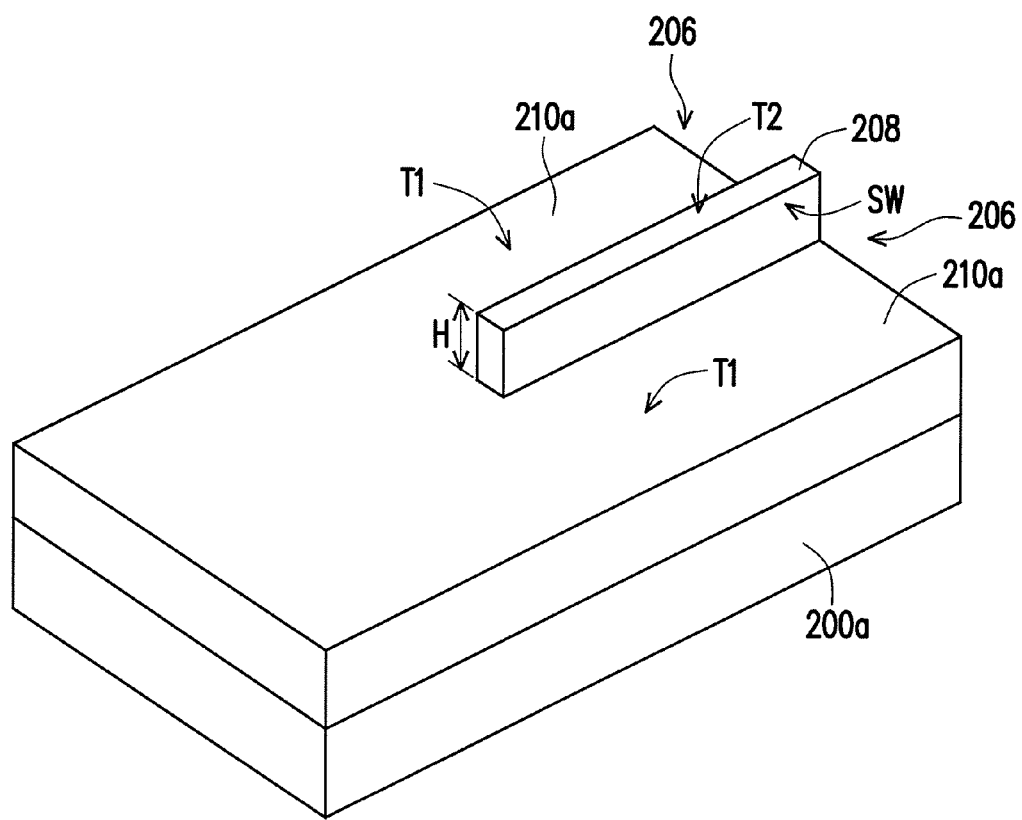

FIG. 2E is a perspective view of the semiconductor device at one of various stages of the manufacturing method. In Step S12 in FIG. 1 and as shown in FIGS. 2D-2E, the polished insulating material 210 filled in the trenches 206 is partially removed by an etch process such that insulators 210a are formed on the substrate 200a. In one embodiment, the etch process may be a wet etch process with hydrofluoric acid (HF) or a dry etch process. The top surfaces T1 of the insulators 210a are lower than the top surface T2 of the semiconductor fin 208. In other words, the semiconductor fin 208 protrudes from the top surfaces T1 of the insulators 210a and sidewalls SW of the semiconductor fin 208 are thus exposed. The height difference between the top surface T2 of the semiconductor fin 208 and the top surfaces T1 of the insulators 210a is H, and the above-mentioned height difference H ranges from about 15 nm to about 50 nm.

Figure 2F:
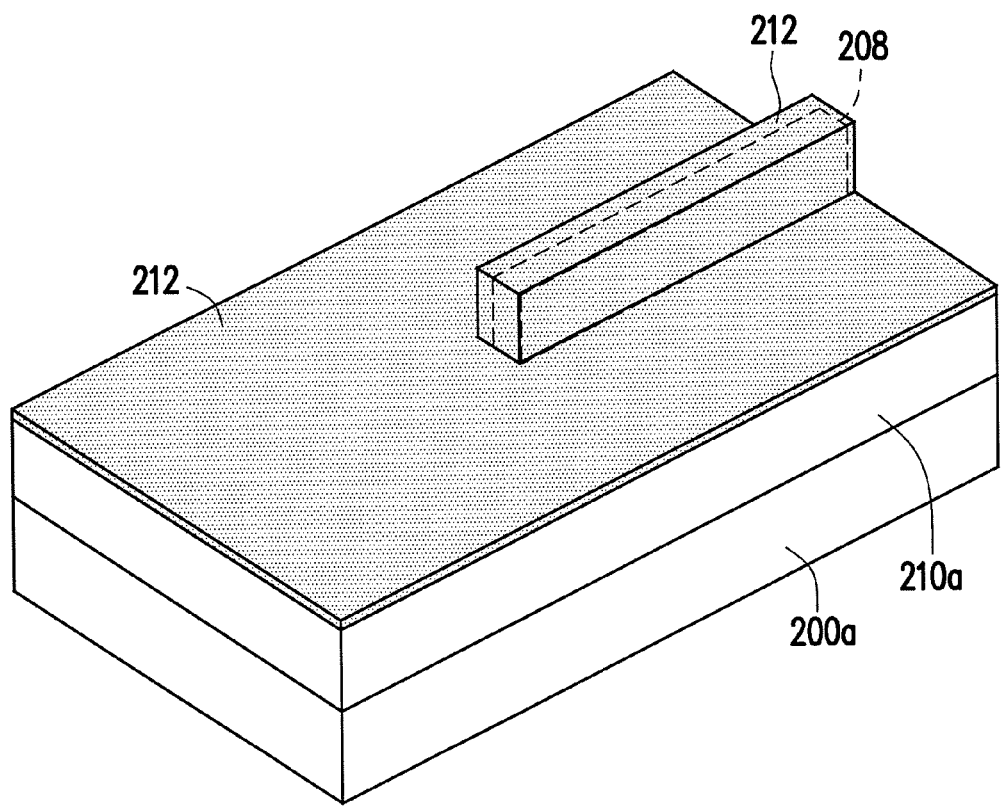

FIG. 2F is a perspective view of the semiconductor device at one of various stages of the manufacturing method. In Step S14 in FIG. 1 and as shown in FIGS. 2E-2F, after the insulators 210a are formed, a dielectric layer 212 is formed to conformally cover the top surface T1 of the insulators 210a, the top surface T2 of the semiconductor fin 208 and the sidewalls SW of the semiconductor fin 208. In one embodiment, the dielectric layer 212 may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The dielectric layer 212 may be formed by a suitable process such as atomic layer deposition (ALD), chemical vapor deposition (CVD), physical vapor deposition (PVD), thermal oxidation or UV-ozone oxidation. The dielectric layer 212 may have suitable thickness and good quality so as to serve as a gate dielectric layer in FinFETs. In some embodiments, for short channel FinFETs (e.g., channel length ranges from 5 nm to 50 nm), the dielectric layer 212 may be a high-k dielectric layer having a thickness in the range of about 0.2 nm to 5 nm. In some alternative embodiments, for long channel FinFETs (e.g., channel length is greater than 50 nm), the dielectric layer 212 may be a high-k dielectric layer having a thickness greater than 5 nm.

Figure 2G:
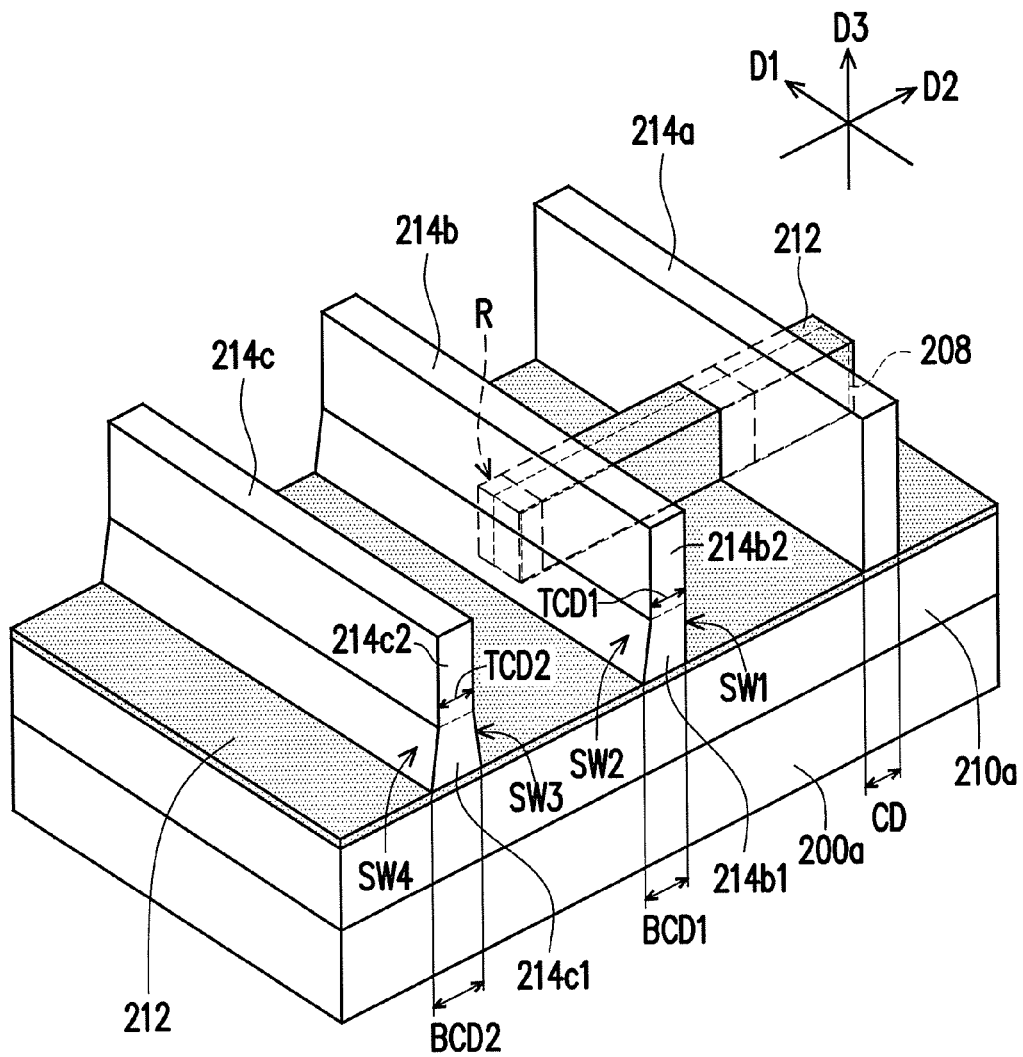

FIG. 2G is a perspective view of the semiconductor device at one of various stages of the manufacturing method. In Step S16 in FIG. 1 and as shown in FIGS. 2F-2G, one first dummy gate strip 214a and two second dummy gate strip 214b, 214c are formed on the dielectric layer 212, wherein a lengthwise direction D1 of the first, second and third dummy gate strips 214a, 214b, 214c is different from a lengthwise direction D2 of the semiconductor fin 208. The lengthwise direction D1 of the first, second and third dummy gate strips 214a, 214b, 214c are perpendicular to the lengthwise direction D2 of the semiconductor fin 208, for example. The number of the dummy gate strips (214a, 214b, 214c) shown in FIG. 2G is merely for illustration. As shown in FIG. 2G, the first dummy gate strip 214a is penetrated by the semiconductor fin 208, the second dummy gate strips 214b, 214c are not penetrated by the semiconductor fin 208. Specifically, the semiconductor fin 208 penetrates the first dummy gate strip 214a from one side to the other side of the first dummy gate strip 214a; one end of the semiconductor fin 208 is embedded in the second dummy gate strip 214b and does not penetrate the second dummy gate strip 214b; and the semiconductor fin 208 is not in contact with the second dummy gate strip 214c. In some alternative embodiments, more than two first dummy gate strips 214a may be formed on the dielectric layer 212 in accordance with actual design requirements; and one or more than three second dummy gate strips 214b, 214c may be formed on the dielectric layer 212 in accordance with actual design requirements.

It should be noted that the formation of the second dummy gate strip 214b or the formation of the second dummy gate strip 214c may be emitted in accordance with actual requirements. In other words, it is not necessary to simultaneously form the second dummy gate strip 214b and the second dummy gate strip 214c on the dielectric layer 212. In some embodiments, merely the first dummy gate strip 214a and the second dummy gate strip 214b are formed on the dielectric layer 212. In some alternative embodiments, merely the first dummy gate strip 214a and the second dummy gate strip 214c are formed on the dielectric layer 212.

The first dummy gate strip 214a and the second dummy gate strips 214b, 214c may be formed by forming a conductive layer on the dielectric layer 212 and patterning the conductive layer so as to form the first dummy gate strip 214a and the second dummy gate strips 214b, 214c. In some embodiments, the patterning process of the conductive layer includes an etch process. The conductive layer may be patterned by $N_2$, He, Ar, $O_2$, $SF_6$, $NF_3$, CxFy (x and y>0), $CF_4$, HBr, $Cl_2$, $CHF_3$, $CH_2F_2$, $SO_2$, $CH_3F$ or other suitable etch gas. The temperature of the above-mentioned etch process ranges from about 10 degree Celsius to about 120 degree Celsius, the pressure of the above-mentioned etch process ranges from about 1 mTorr to about 100 mTorr, the power of the above-mentioned etch process ranges from about 10 W to about 1500 W, and the bias of the above-mentioned etch process ranges from about 10 W to about 1000 W. The first and second dummy gate strips 214a, 214b, 214c include a silicon-containing material, such as polysilicon, amorphous silicon or a combination thereof. In some embodiments, the width of the first dummy gate strip 214a and the second dummy gate strip 214b, 214c may range from 5 nm to 50 nm (i.e., for short channel FinFETs) or may be greater than 50 nm (i.e., for long channel FinFETs).

As shown in FIG. 2G, the first dummy gate strip 214a is penetrated by the semiconductor fin 208 and the width CD of the first dummy gate strip 214a keeps constant in the thickness direction D3. One end of the semiconductor fin 208 is embedded in the second dummy gate strip 214b and the second dummy gate strip 214b includes a broadened portion 214b1 disposed on the dielectric layer 212 and a top portion 214b2 disposed on the broadened portion 214b1, wherein a bottom width BCD1 of the broadened portion 214b1 is greater than a width TCD1 of the top portion 214b2. The width TCD1 of the top portion 214b2 keeps constant in the thickness direction D3, and a top width (TCD1) of the broadened portion 214b1 is substantially equal to width TCD1 of the top portion 214b2. The height of the broadened portion 214b1 of the second dummy gate strip 214b substantially equals to the height of the semiconductor fin 208. The broadened portion 214b1 has a first sidewall SW1 and a second sidewall SW2 opposite to the first sidewall SW1, the broadened portion 214b1 has a recess R located at the first sidewall SW1 for accommodating the end of the semiconductor fin 208, and the second sidewall SW2 of the broadened portion 214b1 is a tapered sidewall. In other words, the broadened portion 214b1 of the second dummy gate strip 214b is an asymmetric geometry.

The semiconductor fin 208 is not in contact with the second dummy gate strip 214c and the second dummy gate strip 214c includes a broadened portion 214c1 disposed on the dielectric layer 212 and a top portion 214c2 disposed on the broadened portion 214c1, wherein a bottom width BCD2 of the broadened portion 214c1 is greater than a width TCD2 of the top portion 214c2. The width TCD2 of the top portion 214c2 keeps constant in the thickness direction D3, and a top width (TCD2) of the broadened portion 214c1 is substantially equal to width TCD2 of the top portion 214c2. The height of the broadened portion 214c1 of the second dummy gate strip 214c substantially equals to the height of the semiconductor fin 208. The broadened portion 214c1 has a first sidewall SW3 and a second sidewall SW4 opposite to the first sidewall SW3, and the first sidewall SW3 and the second sidewall SW4 of the broadened portion 214c1 are tapered sidewalls. In other words, the broadened portion 214c1 of the second dummy gate strip 214c is a symmetric geometry.

Formation of the second dummy gate strips 214b and/or 214c facilitates reduction of loading effect and enlarges process window during fabrication of the first dummy gate strip 214a.

Figure 2H:
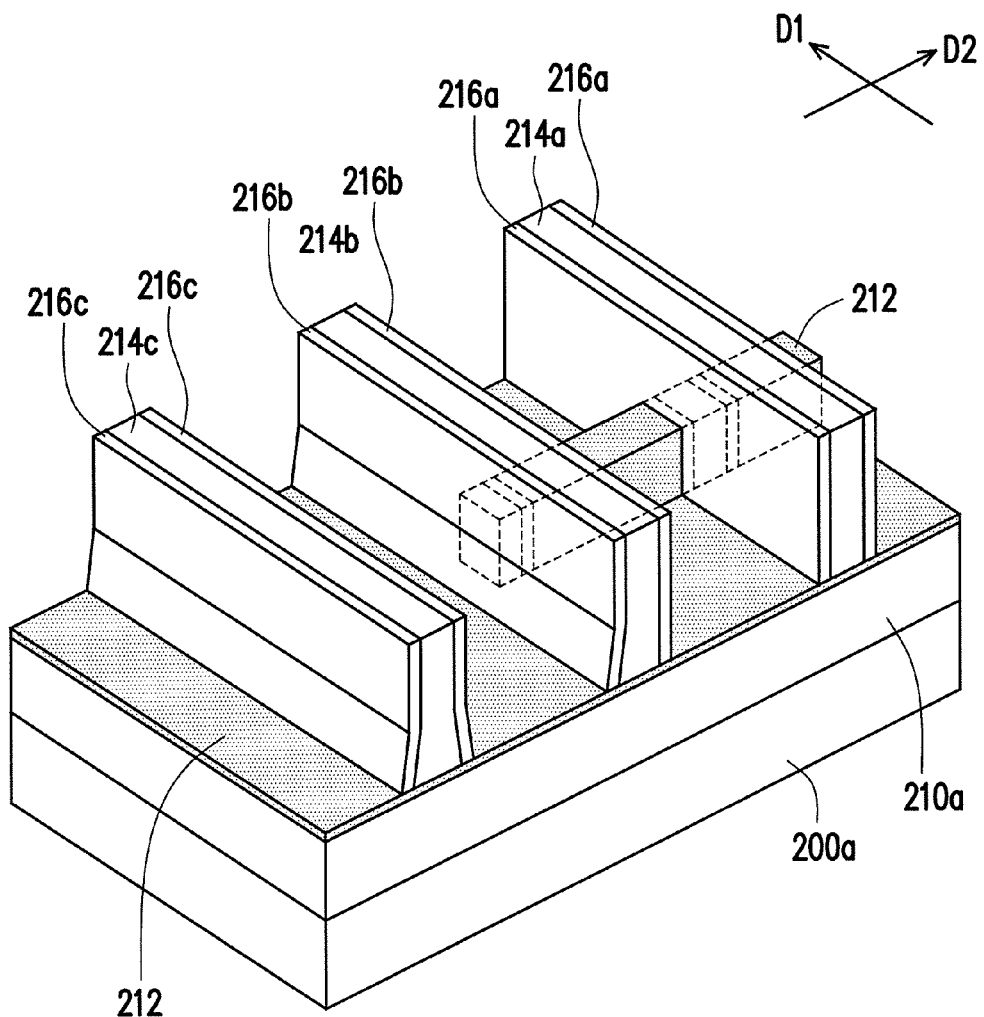

In Step S18 in FIG. 1 and as shown in FIG. 2H, after the first dummy gate strip 214a and the second dummy gate strips 214b, 214c are formed, a pair of first spacers 216a and pairs of second spacers 216b, 216c are formed on sidewalls of the first dummy gate strip 214a and the second dummy gate strips 214b, 214c respectively. As shown in FIG. 2H, the first spacers 216a are formed on the dielectric layer 212 and extend along the sidewalls of the first dummy gate strip 214a, the second spacers 216b are formed on the dielectric layer 212 and extend along the sidewalls of the second dummy gate strip 214b and the second spacers 216c are formed on the dielectric layer 212 and extend along the sidewalls of the second dummy gate strip 214c. The first spacers 216a and the second spacers 216b, 216c are formed of dielectric materials, such as silicon nitride or SiCON. The first and second spacers 216a, 216b may include a single layer or multilayer structure.

Figure 2I:
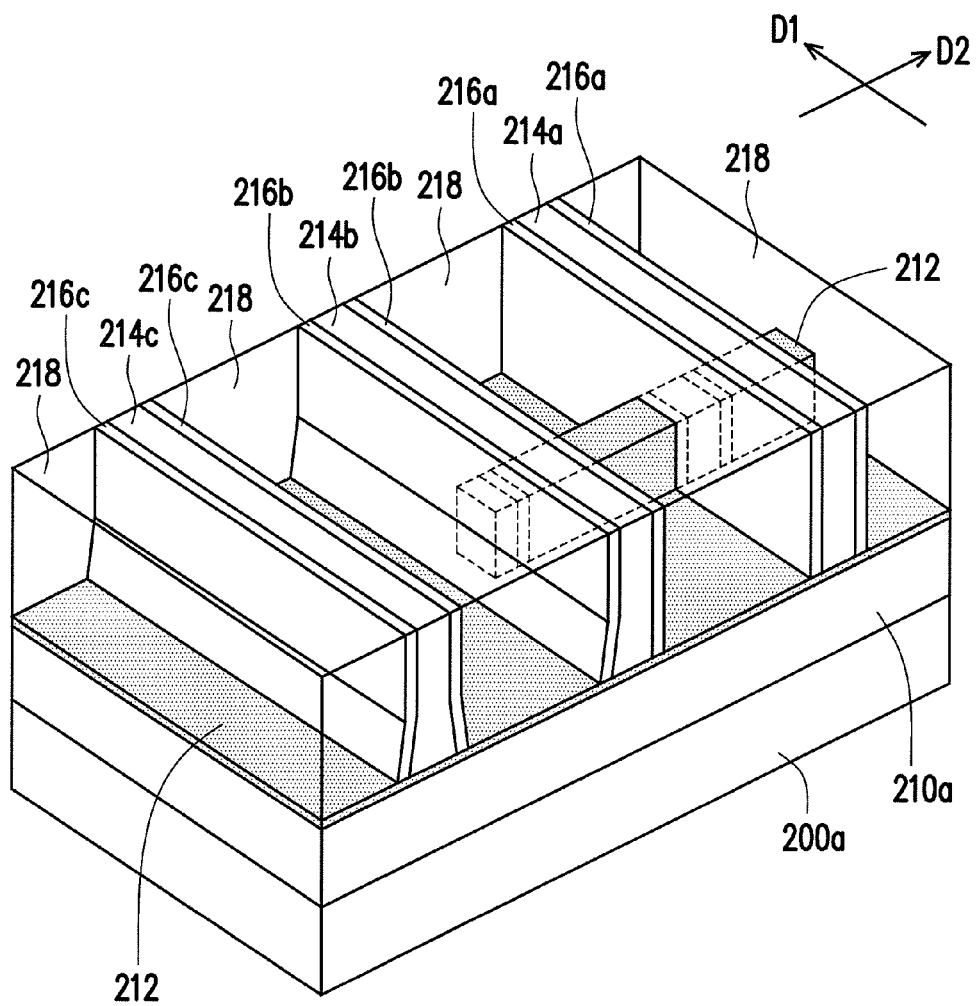

FIG. 2I is a perspective view of the semiconductor device at one of various stages of the manufacturing method. As shown in FIG. 2I, interlayer dielectric layers 218 are formed to cover the dielectric layer 212 that are not covered by the dummy gate strips 214a, 214b, 214c and the spacers 216a, 216b, 216c. Top surfaces of the interlayer dielectric layers 218 are substantially coplanar with top surfaces of the first dummy gate strip 214a and the second dummy gate strips 214b, 214c. In some embodiments, before the interlayer dielectric layers 218 are formed, some processes (e.g., patterning process of dielectric layer 212, fin recessing process, strained source/drain epitaxial process on the semiconductor fin, silicidation process and so on) may be performed in advance. Details of the aforesaid processes are omitted.

In some embodiments, before the gate replacement process is performed, wet cleaning processes are performed. Geometries of the dummy gate strips 214a, 214b, 214c reduce peeling possibility of the dummy gate strips 214a, 214b, 214c.

Figure 2J:
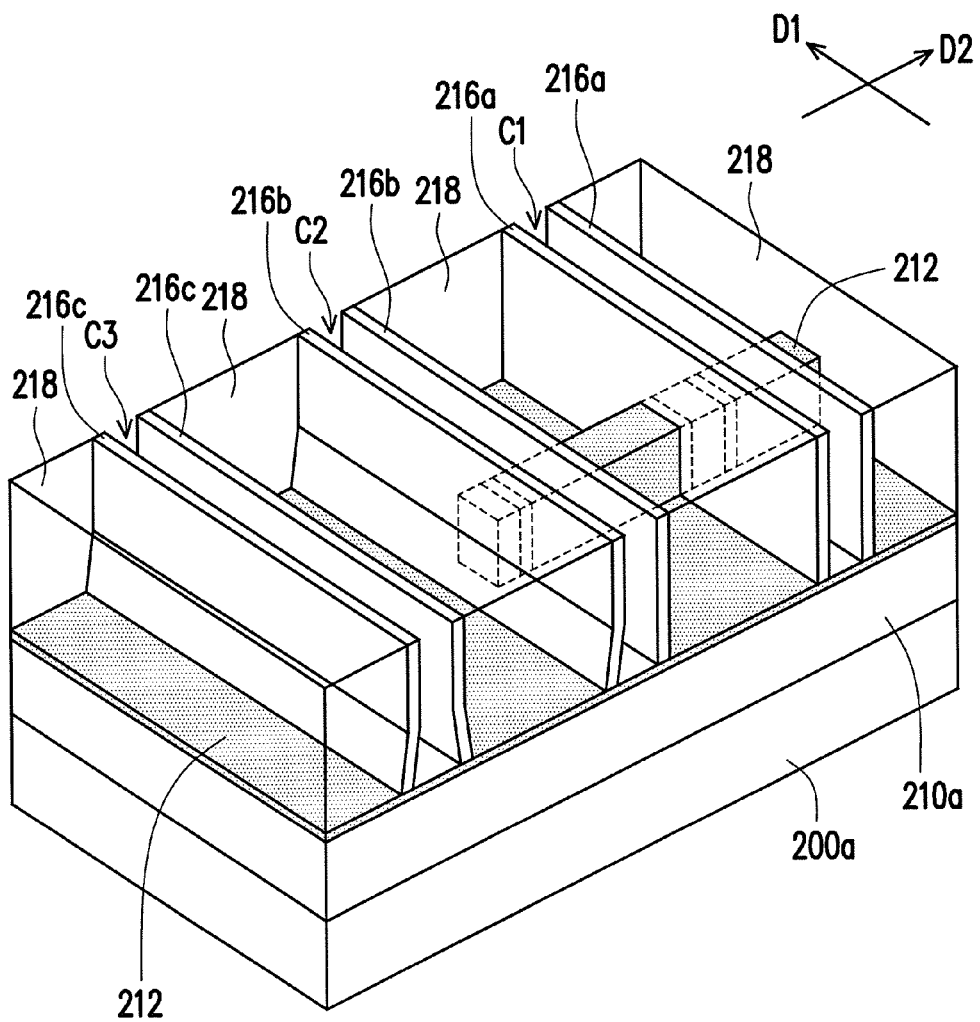

FIG. 2J is a perspective view of the semiconductor device at one of various stages of the manufacturing method. In Step S20 in FIG. 1 and as shown in FIGS. 2I-2J, the first dummy gate strip 214a and the second dummy gate strips 214b, 214c are removed. In one embodiment, the first dummy gate strip 214a and the second dummy gate strips 214b, 214c are removed, for example, by an etch process.

Through properly selecting of etchant, the first dummy gate strip 214a and the second dummy gate strips 214b, 214c are removed without damaging the interlayer dielectric layers 218, the dielectric layer 212, the first spacers 216a and the second spacer 216b, 216c significantly. After the first dummy gate strip 214a and the second dummy gate strips 214b, 214c are removed, a first cavity C1 between the pair of first spacers 216a, a second cavity C2 between the pair of second spacers 216b and a third cavity C3 between the pair of second spacers 216c are formed. In other words, the dielectric layer 212 is partially exposed by the first cavity C1, the second cavity C2 and the third cavity C3.

Figure 2K:
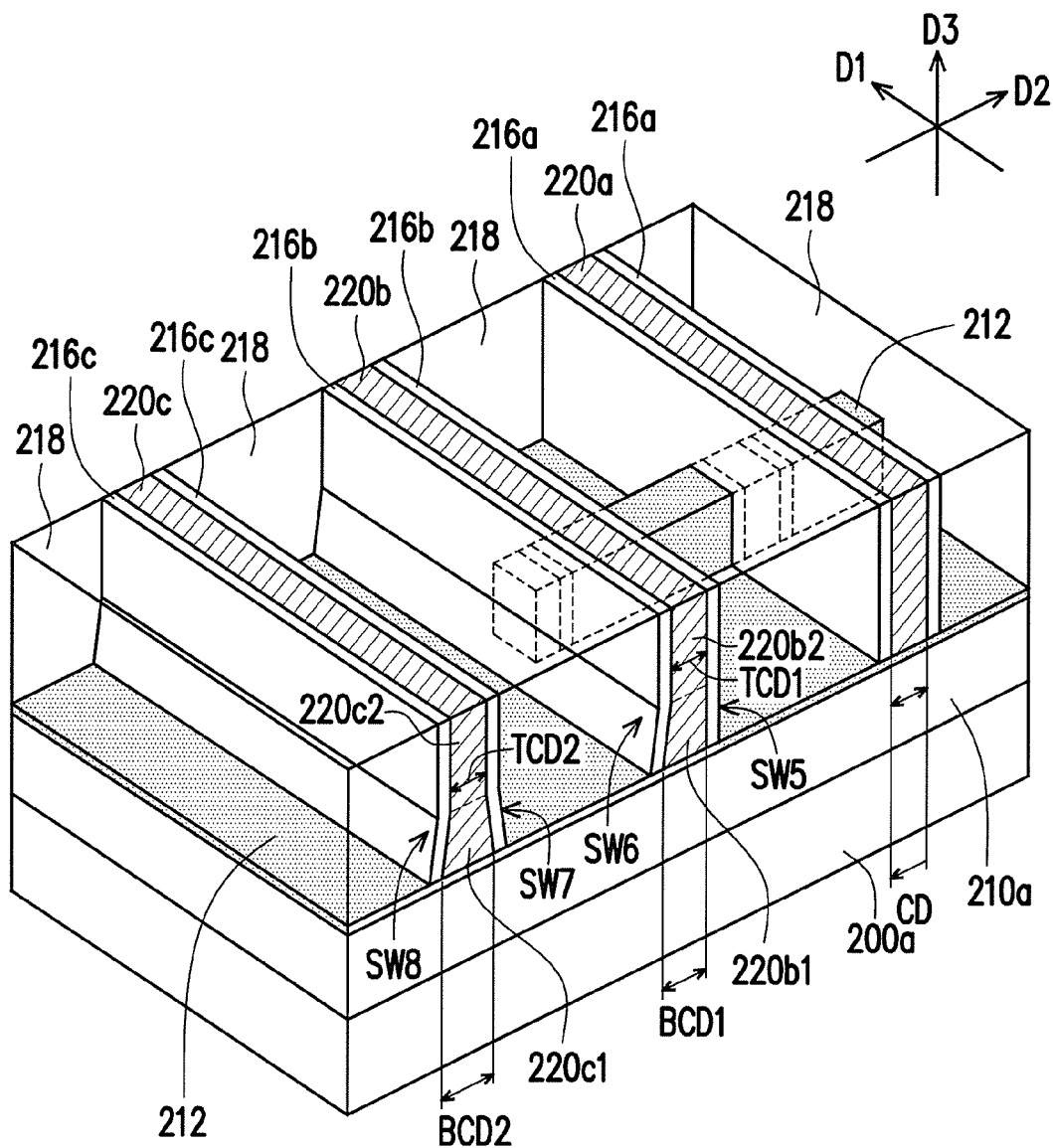

FIG. 2K is a perspective view of the semiconductor device at one of various stages of the manufacturing method. In Step S22 in FIG. 1 and as shown in FIGS. 2J-2K, after the first cavity C1, the second cavity C2 and the third cavity C3 are formed, a first gate 220a is formed in the first cavity C1 and a plurality of second gates 220b, 220c are formed in the second cavity C2 and the third cavity C3 respectively. For example, the first gate 220a and the second gates 220b may be formed by same deposition and chemical mechanical polish (CMP) processes.

As shown in FIG. 2K, the first gate 220a is penetrated by the semiconductor fin 208 and the width CD of the first gate 220a keeps constant in the thickness direction D3. One end of the semiconductor fin 208 is embedded in the second gate 220b and the second gate 220b includes a broadened portion 220b1 disposed on the dielectric layer 212 and a top portion 220b2 disposed on the broadened portion 220b1, wherein a bottom width BCD1 of the broadened portion 220b1 is greater than a width TCD1 of the top portion 220b2. The width TCD1 of the top portion 220b2 keeps constant in the thickness direction D3, and a top width (TCD1) of the broadened portion 220b1 is substantially equal to width TCD1 of the top portion 220b2. The height of the broadened portion 220b1 of the second gate 220b substantially equals to the height of the semiconductor fin 208. The broadened portion 220b1 has a first sidewall SW5 and a second sidewall SW6 opposite to the first sidewall SW5, the broadened portion 220b1 has a recess R located at the first sidewall SW5 for accommodating the end of the semiconductor fin 208, and the second sidewall SW6 of the broadened portion 220b1 is a tapered sidewall. In other words, the broadened portion 220b1 of the second gate 220b is an asymmetric geometry.

The semiconductor fin 208 is not in contact with the second gate 220c and the second gate 220c includes a broadened portion 220c1 disposed on the dielectric layer 212 and a top portion 220c2 disposed on the broadened portion 220c1, wherein a bottom width BCD2 of the broadened portion 220c1 is greater than a width TCD2 of the top portion 220c2. The width TCD2 of the top portion 220c2 keeps constant in the thickness direction D3, and a top width (TCD2) of the broadened portion 220c1 is substantially equal to width TCD2 of the top portion 220c2. The height of the broadened portion 220c1 of the second gate 220c substantially equals to the height of the semiconductor fin 208. The broadened portion 220c1 has a first sidewall SW7 and a second sidewall SW8 opposite to the first sidewall SW7, and the first sidewall SW7 and the second sidewall SW8 of the broadened portion 220c1 are tapered sidewalls. In other words, the broadened portion 220c1 of the second gate 220c is a symmetric geometry.

The first gate 220a serves as gate electrode of a FinFET while the second gates 220b and 220c function as dummy gates. In other words, channel region of the semiconductor fin 208 is covered by the first gate 220a and portions of the semiconductor fin 208 that are covered by the second gates 220b and 220c do not serve as channel regions of FinFETs. Since the above-mentioned second dummy gate strips 214b and 214c includes broadened portions 214b1 and 214c1, process window of gate replacement process is enlarged. Therefore, yield and reliability of the semiconductor device are enhanced.

In accordance with some embodiments of the present disclosure, a method for fabricating a semiconductor device includes at least the following steps. A substrate is patterned to form a plurality of trenches in the substrate and a semiconductor fin between the trenches. A plurality of insulators are formed in the trenches and a dielectric layer is formed to cover the semiconductor fin and the insulators. A first dummy gate strip and a second dummy gate strip are formed on the dielectric layer, wherein a lengthwise direction of the first and second dummy gate strips is different from a lengthwise direction of the semiconductor fin, wherein the first dummy gate strip is penetrated by the semiconductor fin, the second dummy gate strip is not penetrated through by the semiconductor fin, and a bottom width of the second dummy gate strip is greater than a top width of the second dummy gate strip. A pair of first spacers and a pair of second spacer are formed on sidewalls of the first dummy gate strip and the second dummy gate strip respectively. The first and second dummy gate strips are removed. A first gate and a second gate are formed between the pair of first spacers and the pair of second spacers respectively.

In accordance with alternative embodiments of the present disclosure, a semiconductor device including a substrate, a plurality of insulators, a dielectric layer, a first gate and a second gate is provided. The substrate includes a plurality of trenches and a semiconductor fin between trenches. The insulators are disposed in the trenches. The dielectric layer covers the semiconductor fin and the insulators. The first gate is disposed on the dielectric layer and is penetrated by the semiconductor fin. The second gate is disposed on the dielectric layer, wherein a lengthwise direction of the first and second gates is different from a lengthwise direction of the semiconductor fin, the second gate is not penetrated through by the semiconductor fin, and a bottom width of the second gate is greater than a top width of the second gate.

In accordance with yet alternative embodiments of the present disclosure, a semiconductor device including a substrate, a plurality of insulators, a dielectric layer and a plurality of gates is provided. The substrate includes a plurality of trenches and a semiconductor fin between trenches. The insulators are disposed in the trenches. The dielectric layer covers the semiconductor fin and the insulators. A lengthwise direction of the gates is different from a lengthwise direction of the semiconductor fin. The gates comprise at least one first gate that is penetrated by the semiconductor fin and at least one second gate that is not penetrated through by the semiconductor fin. The second gate comprises a broadened portion disposed on the dielectric layer and a top portion disposed on the broadened portion, wherein a bottom width of the broadened portion is greater than a width of the top portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate comprising a plurality of trenches and a semiconductor fin between trenches;
   a plurality of insulators in the trenches;
   a dielectric layer covering the semiconductor fin and the insulators;
   a first gate disposed on the dielectric layer, the first gate being penetrated by the semiconductor fin; and
   a second gate disposed on the dielectric layer, a lengthwise direction of the first and second gates being different from a lengthwise direction of the semiconductor fin, wherein the second gate is not penetrated through by the semiconductor fin, and a bottom width of the second gate is greater than a top width of the second gate.

2. The semiconductor device of claim 1, wherein an end of the semiconductor fin is embedded in the second gate.

3. The semiconductor device of claim 2, wherein the second gate comprises:
   a broadened portion disposed on the dielectric layer; and
   a top portion disposed on the broadened portion, wherein a bottom width of the broadened portion is greater than a width of the top portion.

4. The semiconductor device of claim 3, wherein a height of the broadened portion of the second gate substantially equals to a height of the semiconductor fin.

5. The semiconductor device of claim 3, wherein the broadened portion has a first sidewall and a second sidewall opposite to the first sidewall, the broadened portion has a recess located at the first sidewall for accommodating the end of the semiconductor fin, and the second sidewall of the broadened portion is a tapered sidewall.

6. The semiconductor device of claim 1, wherein the semiconductor fin is not in contact with the second gate.

7. The semiconductor device of claim 6, wherein the second gate comprises:
   a broadened portion disposed on the dielectric layer; and
   a top portion disposed on the broadened portion, wherein a bottom width of the broadened portion is greater than a width of the top portion.

8. The semiconductor device of claim 7, wherein a height of the broadened portion of the second gate substantially equals to a height of the semiconductor fin.

9. The semiconductor device of claim 7, wherein the broadened portion has a first sidewall and a second sidewall opposite to the first sidewall, the first sidewall and the second sidewall of the broadened portion are tapered sidewalls.

10. A semiconductor device, comprising:
    a substrate comprising a plurality of trenches and a semiconductor fin between trenches;
    a plurality of insulators in the trenches;
    a dielectric layer covering the semiconductor fin and the insulators;
    a plurality of gates disposed on the dielectric layer, a lengthwise direction of the gates being different from a lengthwise direction of the semiconductor fin, the gates comprising at least one first gate that is penetrated by the semiconductor fin and at least one second gate that is not penetrated through by the semiconductor fin, the second gate comprising:
    a broadened portion disposed on the dielectric layer; and
    a top portion disposed on the broadened portion, wherein a bottom width of the broadened portion is greater than a width of the top portion.

11. The semiconductor device of claim 10, wherein an end of the semiconductor fin is embedded in the second gate.

12. The semiconductor device of claim 11, wherein a height of the broadened portion of the second gate substantially equals to a height of the semiconductor fin.

13. The semiconductor device of claim 11, wherein the broadened portion has a first sidewall and a second sidewall opposite to the first sidewall, the broadened portion has a recess located at the first sidewall for accommodating the end of the semiconductor fin, and the second sidewall of the broadened portion is a tapered sidewall.

14. The semiconductor device of claim 10, wherein the semiconductor fin is not in contact with the second gate.

15. The semiconductor device of claim 14, wherein a height of the broadened portion of the second gate substantially equals to a height of the semiconductor fin.

16. The semiconductor device of claim 14, wherein the broadened portion has a first sidewall and a second sidewall opposite to the first sidewall, the first sidewall and the second sidewall of the broadened portion are tapered sidewalls.

* * * * *